United States Patent
Virolainen

(10) Patent No.: US 7,508,688 B2
(45) Date of Patent: Mar. 24, 2009

(54) METHOD AND ARRANGEMENT FOR MEASURING OUTPUT PHASE CURRENTS OF A VOLTAGE SOURCE INVERTER UNDER A LOAD

(75) Inventor: Panu Virolainen, Espoo (FI)

(73) Assignee: ABB Oy, Helsinki (FI)

(*) Notice: Subject to any disclaimer, the term of this patent is extended or adjusted under 35 U.S.C. 154(b) by 175 days.

(21) Appl. No.: 11/540,638

(22) Filed: Oct. 2, 2006

(65) Prior Publication Data
US 2007/0085546 A1 Apr. 19, 2007

(30) Foreign Application Priority Data
Oct. 19, 2005 (EP) .................. 05109738

(51) Int. Cl.
*H02M 7/48* (2007.01)
(52) U.S. Cl. ..................... 363/95
(58) Field of Classification Search .......... 363/95, 363/97, 98
See application file for complete search history.

(56) References Cited

U.S. PATENT DOCUMENTS

| | | | |
|---|---|---|---|
| 4,213,134 A | 7/1980 | Chen | |
| 4,791,404 A | 12/1988 | Hollister | |
| 5,309,349 A * | 5/1994 | Kwan | 363/98 |
| 5,376,881 A * | 12/1994 | Takahashi | 324/158.1 |
| 5,581,452 A * | 12/1996 | Yamamoto | 363/41 |
| 5,969,958 A * | 10/1999 | Nielsen et al. | 363/41 |
| 6,049,474 A * | 4/2000 | Platnic | 363/98 |
| 6,735,537 B2 * | 5/2004 | Liu et al. | 702/64 |
| 7,042,191 B2 * | 5/2006 | Hirono | 318/801 |
| 7,102,327 B2 * | 9/2006 | Ho | 318/812 |
| 7,348,758 B2 * | 3/2008 | Ho | 318/811 |

FOREIGN PATENT DOCUMENTS

| | | |
|---|---|---|
| EP | 0 534 362 A2 | 3/1993 |
| EP | 0 648 008 A1 | 4/1995 |
| JP | 63-228969 A | 9/1988 |
| JP | 4-156292 A | 5/1992 |

OTHER PUBLICATIONS

International Search Report dated Mar. 28, 2006.

* cited by examiner

*Primary Examiner*—Jeffrey L Sterrett
(74) *Attorney, Agent, or Firm*—Buchanan Ingersoll & Rooney PC

(57) ABSTRACT

A method and arrangement for measuring output phase currents of a voltage source inverter when the inverter is connected to a load, the method comprising, during commissioning of a drive, the steps of forming consecutive voltage pulses to the load by using the inverter, measuring current of a DC bus for each consecutive pulse such that for each consecutive pulse, a time difference between a current measurement instant and a start of a voltage pulse is changed, removing a value of DC current from measured current samples to obtain sample values for stray current, storing the sample values of the stray current and their time instants with respect to the start of respective voltage pulses, the method further comprising during the use of the inverter the following steps of, measuring DC-bus current, determining an output phase current of the inverter from the measured DC-bus current and from the stored stray current samples.

20 Claims, 8 Drawing Sheets

METHOD AND ARRANGEMENT FOR MEASURING OUTPUT PHASE CURRENTS OF A VOLTAGE SOURCE INVERTER UNDER A LOAD

FIELD OF THE INVENTION

The present invention relates to a method and arrangement for measuring inverter output phase currents, and more particularly to a method in which phase currents are measured using measurement in a DC-voltage intermediate circuit.

BACKGROUND OF THE INVENTION

Voltage source inverters are commonly used for controlling electrical loads such as motors or generators with controllable frequency. Voltage source inverters have a direct current intermediate circuit, through which energy is transferred as a DC voltage to the output switches of the inverter, which further generate DC voltage pulses to the load.

These voltage pulses are stepwise voltage changes which are known to generate a capacitive charge and discharge currents. Cables that are connected from the output of an inverter to the load are somewhat capacitive against the earth and against the cables of other phases, and this capacitance is charged when the output voltage of the inverter changes abruptly.

When a load current is measured in the inverter, i.e. at the beginning of the cable, charge and discharge currents are seen as part of the measured total current. This causes errors in the measurement since only the current fed to the load is of importance to the control. Effects of capacitive stray currents have the most dominant role when cables are long and the load is low-powered. In such a situation, the capacitance is large due to the long cables and the nominal current of the load being low. This leads to a situation where the magnitude of the stray currents is at its highest when compared to the load current.

When each phase current is measured separately, the above problem are avoided by timing the measurement such that the effects of the stray current are decreased. This can be carried out for example by measuring the current at a specific instant which is long after the previous change of the inverter output state.

It is known in the art that the output current can be measured in an intermediate voltage circuit. All current outputted from an inverter is flown through the intermediate circuit. By measuring the current of the plus or minus voltage bus and by knowing the state of the output switches at the time of a current sample, it is possible to know to which phase the measured current flows. It is thus possible to reconstruct the phase currents one at a time from the output switch positions and current samples. In this measurement method, only one current transducer is needed for making DC current measurement cost effective and simple. Further, the use of DC current measurement requires little space since only one current transducer is needed. These advantages make the DC-current measurement an attractive choice.

In DC current measurement, current measurement is carried out when an active voltage vector, i.e. not a zero vector, is chosen since a DC bus carries no current when a zero vector is selected. Modulation schemes can be selected such that an active voltage vector enabling a current measurement is chosen at a predetermined time instant. This time instant in relation to a modulation period is usually at the beginning or in the middle of each period.

The most problematic situations for DC current measurement are those with a low output frequency, where a generated output voltage is low and a modulation pattern only comprises short periods where an active voltage vector is in use. This automatically means that possible time instants for the measurement of current are timely in close proximity with voltage changes, and the measured currents include, in addition to a load current, disturbing amounts of stray currents. This situation is described in FIG. 1, where the upper three plots represent output voltages of phases A, B and C, while the lower three plots represent a total current measurable in the DC-bus, capacitive stray current and load current. A possible current measurement period is marked with a two-ended arrow. This period is the time in the modulation period during which the voltage vector is active and not a zero vector. As seen in FIG. 1, oscillations caused by the charge and discharge currents do not decay during the possible current measurement period. Thus, the problem relating to DC current measurement is the inability to measure the load current only.

BRIEF DESCRIPTION OF THE INVENTION

An object of the present invention is thus to provide a method and an arrangement for implementing the method so as to overcome the above problem in measuring a DC current of an intermediate voltage circuit and to obtain reliable phase current information representing the current of a load. The object of the invention is achieved by a method and an arrangement which are characterized by what is stated in the independent claims. Preferred embodiments of the invention are disclosed in the dependent claims.

The invention is based on the idea of measuring, at precise intervals, charge and discharge currents before actual use of the inverter. This measured information is then used during the use of the inverter to obtain as accurate load current values as possible.

An advantage of the method of the invention is that the load current can be determined more accurately using DC-current measurement. If the load is an electrical motor, the whole control of the drive is usually dependent on the accuracy of the load current values. A stator current is also used in estimations of motor parameters, as an input to motor models depicting the electrical state of the motor, and in other control related processes calculated in the processors of control equipment of a frequency converter.

BRIEF DESCRIPTION OF THE DRAWINGS

In the following, the invention will be described in greater detail by means of preferred embodiments and with reference to the attached drawings, in which.

DETAILED DESCRIPTION OF THE INVENTION

In the method of the invention, the first steps are taken during commissioning of an inverter in question i.e. before actual use of the inverter. When both the inverter and a load, which usually is a motor, are properly installed and connected via cabling, a drive is put to use by starting an identification procedure. Identification procedures are commonly used before the first start where a frequency converter executes a procedure where it measures different values, generates parameters for the control, etc. As a part of this routine, according to the present invention, a voltage source inverter forms consecutive voltage pulses to the load. These voltage pulses are preferably identical to each other and generated with the same phase. After each pulse, a current sample is taken. The measurement instant of the current measurement is changed in respect to each voltage pulse, and only one current sample is taken during each voltage pulse. The measurement instant is changed in small steps, so that sample data represent the current as well as possible.

Figure 8:
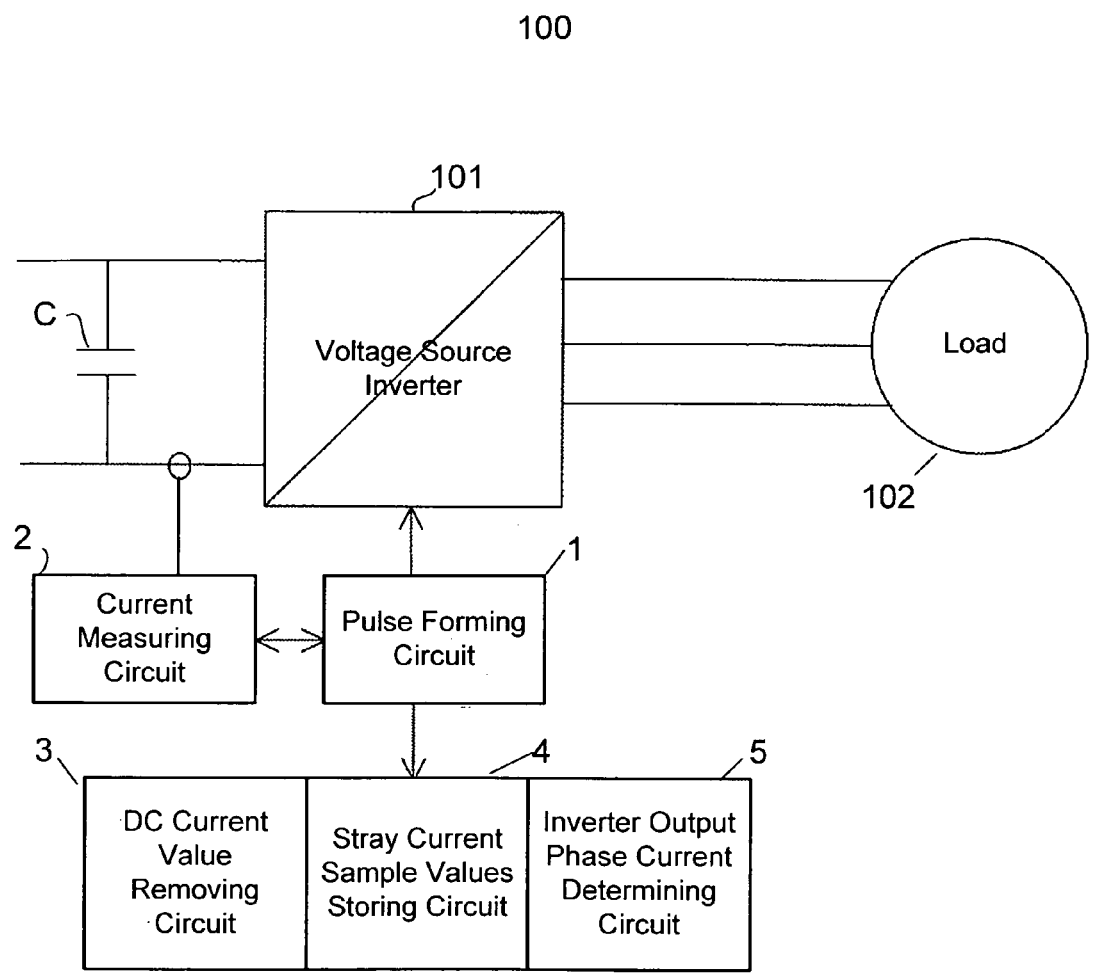
FIG. 8 shows an exemplary arrangement for measuring output phase currents of a voltage source inverter when the inverter is connected to a load.

In another aspect, as shown in FIG. 8, an exemplary arrangement (100) for measuring output phase currents of a voltage source inverter (101) when the inverter is connected to a load (102) is disclosed. Such an exemplary arrangement (100) comprises means for forming (1) consecutive voltage pulses to the load by using the inverter, means for measuring (2) current of a DC-bus for each consecutive pulse such that for each consecutive pulse, a time difference between a current measurement instant and a start of a voltage pulse is changed, means for removing (3) a value of DC current caused by the consecutive voltage pulses from measured current samples to obtain sample values for stray current, means for storing (4) the sample values of the stray current and their time instants with respect to the start of respective voltage pulses, and means for determining (5) an output phase current of the inverter during use of the inverter from the measured DC bus current and from the stored stray current samples.

The frequency of capacitive oscillation is typically in the range of 100 kHz to 1 MHz, depending on the type and length of the cabling. This means that minimum sampling frequency should be at least 2 MHz so that sample data can be gathered without aliasing of the data. Current transducers achieving these kinds of frequencies are costly, and during normal use of the inverter the gain achieved with them would be minimal. Thus sampling of the current by shifting the sampling instant with respect to the start of the voltage pulse is a more cost effective solution giving same results during the operation of the inverter. If, for example, a sampling rate is selected to be 18.75 MHz, the resolution of the current samples becomes 53 ns. Thus the timing of measurement is changed 53 ns for each voltage pulse.

Figure 1:
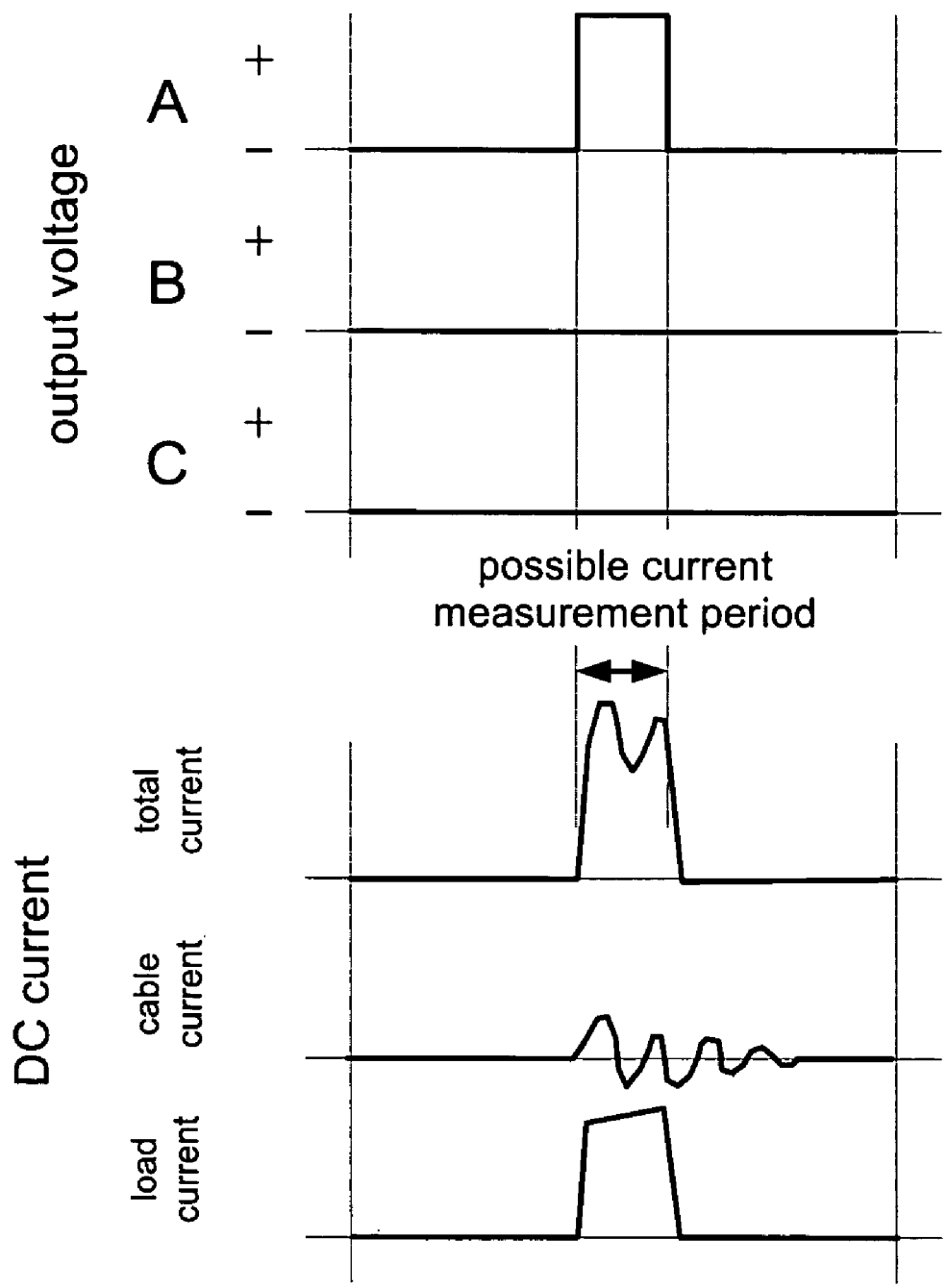
FIG. 1 illustrates one modulation period and a possible DC-current measurement period in the modulation period and a basic waveform of capacitive stray currents.
Figure 2A:
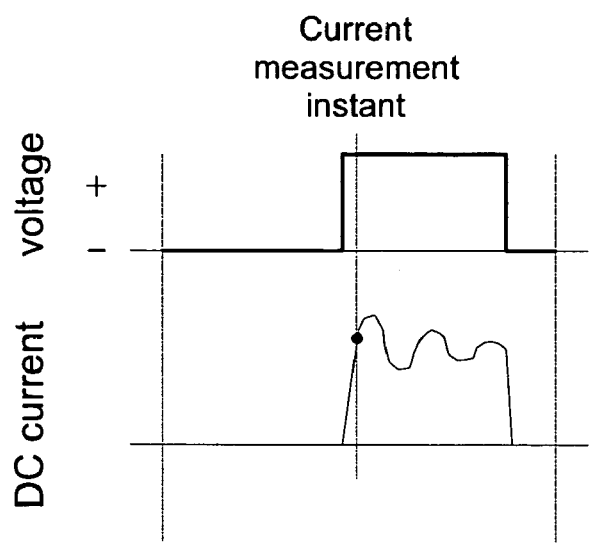
FIG. 2 illustrates one embodiment of sampling of a total current.
Figure 2B:
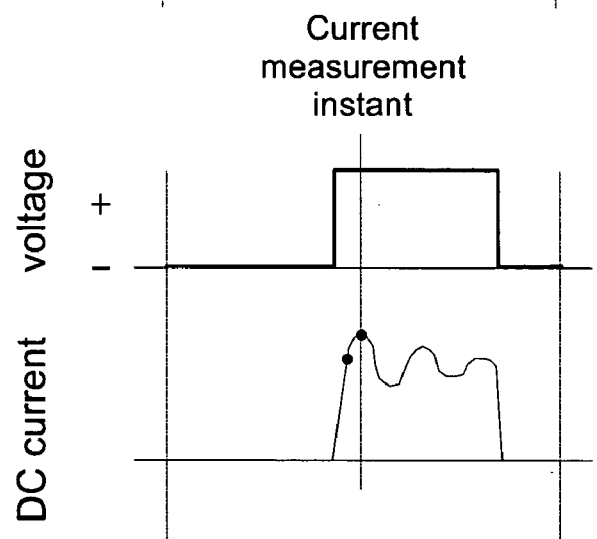
Figure 2C:
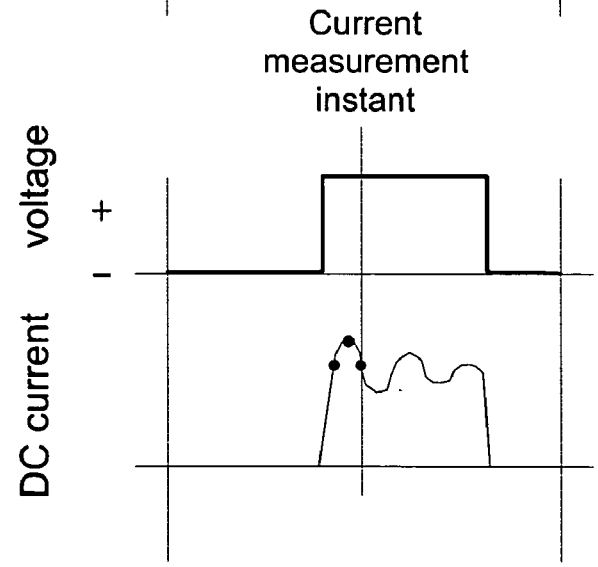

FIG. 2 shows one possible way of sampling the current. The first voltage pulse is generated in FIG. 2a, and the DC-current is measured time period ts after the voltage pulse. Time period ts corresponds to the time resolution of the measurement. In FIG. 2b, it can be seen that the voltage pulse is generated earlier in the modulation period than in FIG. 2a, but the measurement is carried out at the same instant in the modulation period. Thus, the time difference between the start of the voltage pulse and the measurement is changed. Similarly, in FIG. 2c, the voltage pulse is generated further earlier by ts, and the third current sample is measured.

Figure 3A:
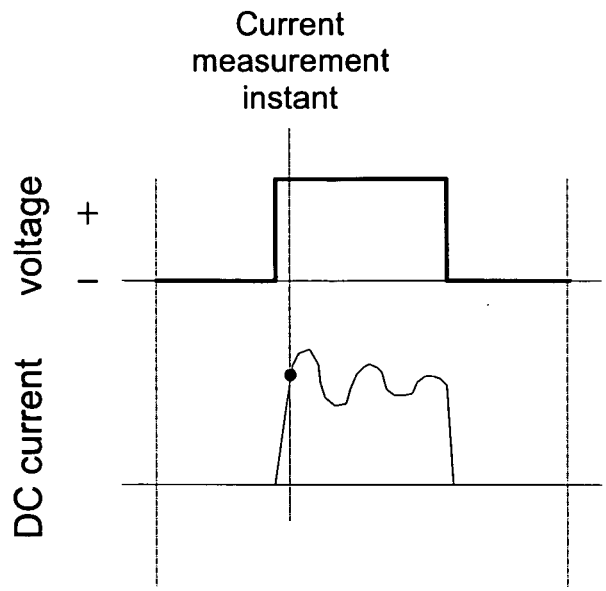
FIG. 3 illustrates another embodiment of the sampling of the total current.
Figure 3B:
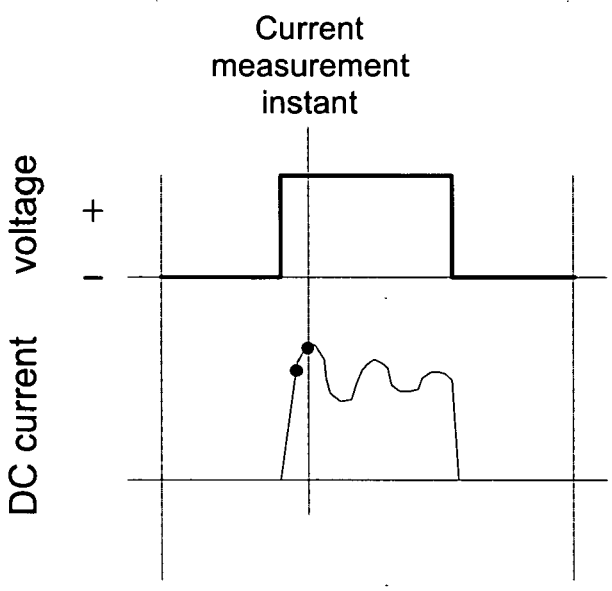
Figure 3C:
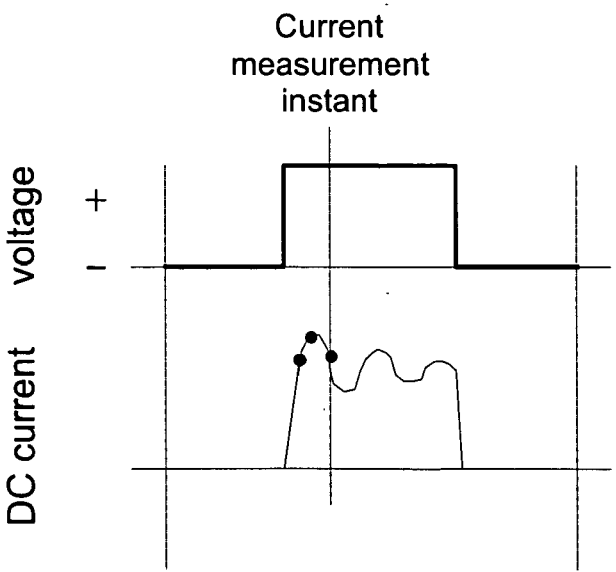

FIG. 3 shows an alternative way of sampling the current. In this embodiment, the voltage pulse is kept similar and timely in the same place from period to period, but the measurement instant is changed from each previous pulse by ts. In both FIGS. 2 and 3, the consecutive pulses are formed from pulses represented in plots a, b and c.

By sampling the current as described above, the total current flowing from the inverter part of the frequency converter is gained. In the method according to the invention, the value of the DC current caused by the consecutive voltage pulses is removed from the measured current samples to obtain sample values for stray current.

At its simplest, the removal of the DC current can be carried out by estimating the load current and subtracting the load current from the samples. The load current can be estimated by dividing the average voltage caused by the consecutive voltage pulses by the load resistance. If the load is an electrical motor, the load resistance is the stator resistance, which is also a typical quantity estimated during an identification run. The average voltage caused by the voltage pulses is easy to calculate, since the pulse sequence is determined beforehand.

If ripple currents that are fed to the load are large, they can also be taken into account in the calculation of the stray currents. A ripple current caused by a transient inductance of the load can be calculated by integrating equation $$u = L\frac{di}{dt},$$

where L represents a transient inductance of the load, and u instantaneous value of voltage, which, in the case of a voltage source inverter, is the DC voltage. If the load is a motor, the transient inductance L can also be estimated during the commissioning of the drive.

When the DC-current to the load and possibly also the ripple current are subtracted from the sample data, the remaining current is the sample data of the capacitive stray current.

Another possibility of removing the DC-current component from the sample data is to high-pass filter the data. The high-pass filter only leaves the highest frequency components to remain and thus blocks the DC-current and even the ripple current from the sample data.

One other possibility of removing the effects of load current is to derive the oscillation frequency, starting amplitude of the oscillation and attenuation time constant by using signal processing algorithms. This leads to equation of the type $i = i_a \cos(\omega t) e^{-t/\tau}$, where $i_a$ is the starting amplitude, $\tau$ is the attenuation time constant and $\omega$ is the oscillation frequency.

The values of stray currents are stored together with their time instants with respect to the start of the respective voltage pulses, and the formation of the voltage pulses is stopped. It should be noted that if a function, rather than samples, is formed, the parameters of that function are stored in the memory of the device. It should also be noted that it is possible to subtract the load current and ripple current from the measured samples immediately after the sample is taken, if the values of load current and ripple current are known.

Voltage pulses are formed as long as necessary for obtaining a representative sample, or so that oscillation is decayed to a level unnecessary to take into account.

If the accuracy of the load current is very important, DC-currents can be measured for various different switching situations. Measurements can be carried out for example for each output phase separately or for different usual modulation patterns.

After the sample data representing the capacitive stray currents have been stored, the sample data is ready to be put to use.

During the use of the inverter, DC bus current is measured and the output phase current is determined from the measured current and from the stored data. The stored data can be used in different ways. Preferably, the DC current measurement is carried out in a normal way, which means that DC current is measured at a specific instant in a modulation period. This instant can be for example at the end or beginning of the modulation period or in the middle of the modulation period.

Figure 7:
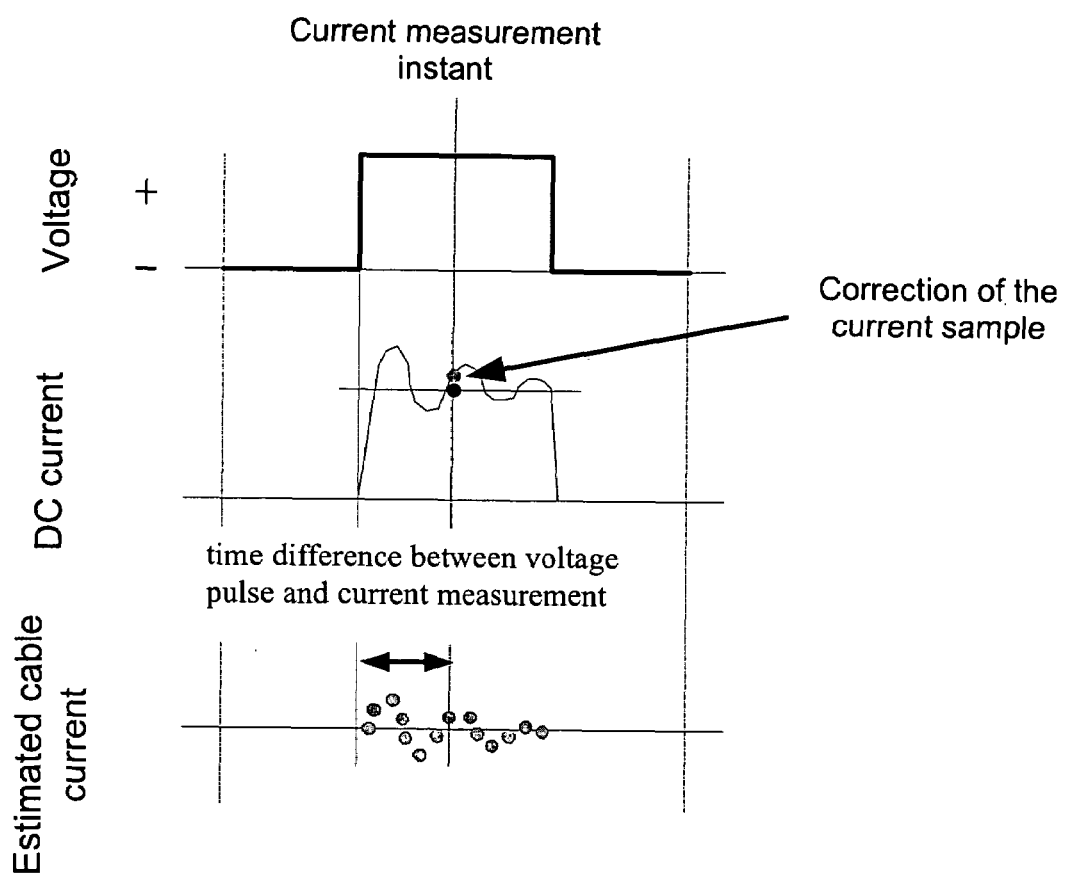
FIG. 7 shows a principle of correcting DC-current using measured sample data.

The effects of capacitive currents are then removed from the measured DC current to achieve output phase current that represents the real current flowing to the load. In the case of a one-phase system, the removal of the capacitive currents can simply be carried out by calculating the time from the output voltage change to the measurement instant, and subtracting a stored data sample which was taken at a corresponding instant. This is shown in FIG. 7, where the upper plot is the voltage pulse, the middle plot is the DC current, and the lower plot shows the stored sample data as separate samples in time domain. In the example of FIG. 7, the sample corresponding to the time period between the switching and the DC current measurement, which is shown in the middle plot as a two-ended arrow, is subtracted from the measured DC-current. This subtraction gives the value of the load current.

Figure 5A:
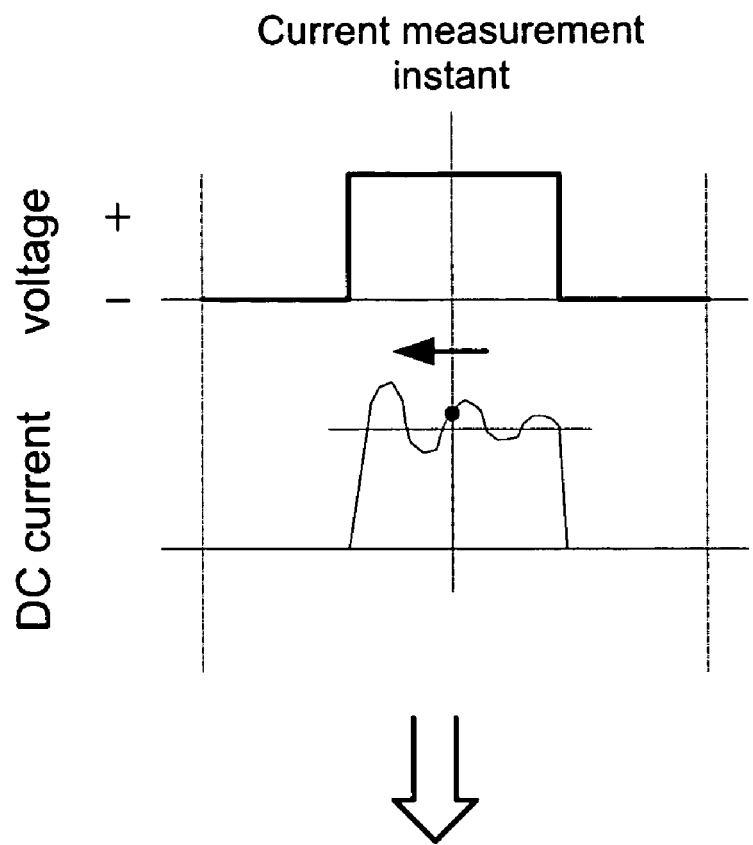
FIG. 5 shows measurement of DC current when a measurement time is changed.
Figure 5B:
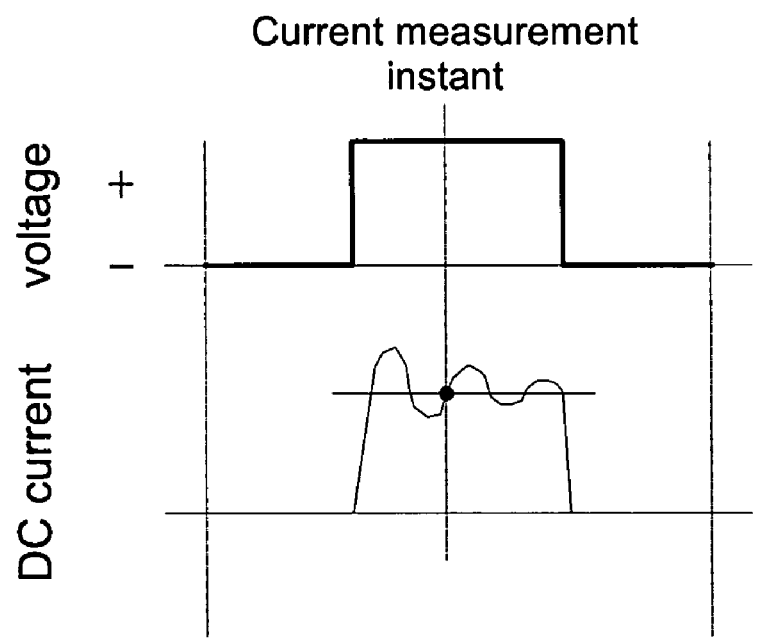
Figure 6A:
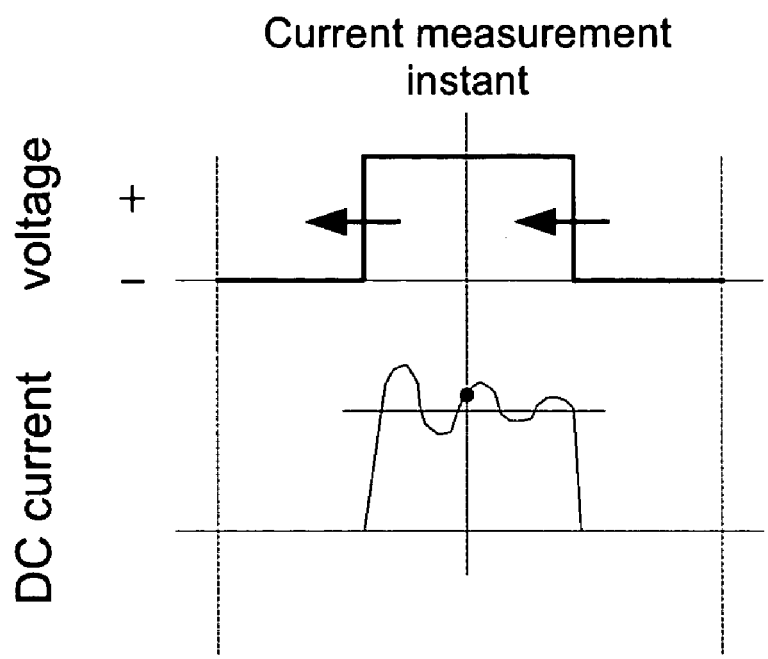
FIG. 6 shows measurement of DC-current when timing of the voltage pulse is changed.
Figure 6B:
Figure 6B:
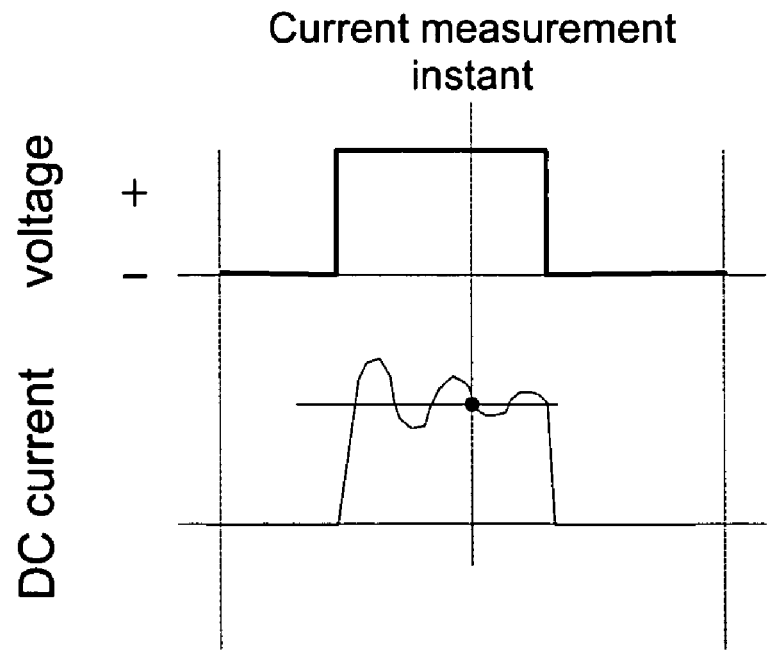

Another possibility to take the sample data into account is to carry out the measurement at a time instant at which the capacitive current is known to have a zero crossing point. This variation may utilize of the stored information on the frequency of the oscillation. This can be carried out either by changing the DC current measurement instant as shown in FIGS. 5a and 5b, or by changing the starting time of the voltage pulse, as shown in FIGS. 6a and 6b. In FIGS. 5a and 6a, the voltage pulse is shown in the upper plot and the DC current is shown in the lower plot. A normal measurement instant is shown to be in the middle of the modulation period. As seen in the lower plots, the DC current measured at a normal measurement time comprises an error due to the capacitive current.

In FIG. 5b, the measurement instant is changed such that the measurement is carried out earlier than in FIG. 5a. At this measurement instant, the capacitive stray current has a zero crossing point, and thus the measured DC current corresponds to the load current.

In FIG. 6b, the voltage pulse is given earlier than in FIG. 6a, which results in a measurement instant at which the capacitive stray current has a value zero, and thus the DC current measurement gives desired results. Embodiments where the measurement is carried out at the zero crossing point may not be usable in all situations. If the cables are long, a situation may occur where the stray current does not have a zero crossing point during a very short voltage pulse, i.e. during the possible current measurement time period.

However, the straightforward subtraction of stored data is considered to be easier to accomplish than the variation of the measurement instant or of the voltage pulse inside the modulation period. The subtraction of stored data also functions properly even with the most problematic situations.

In the case of multiple phased systems, such as a common three-phase system, the capacitive current seen in the DC-current is affected by all inverter output state changes during the modulation period in which the DC-current is measured. This means that the changes of all inverter phases have to be taken into account in the stray currents.

Figure 4:
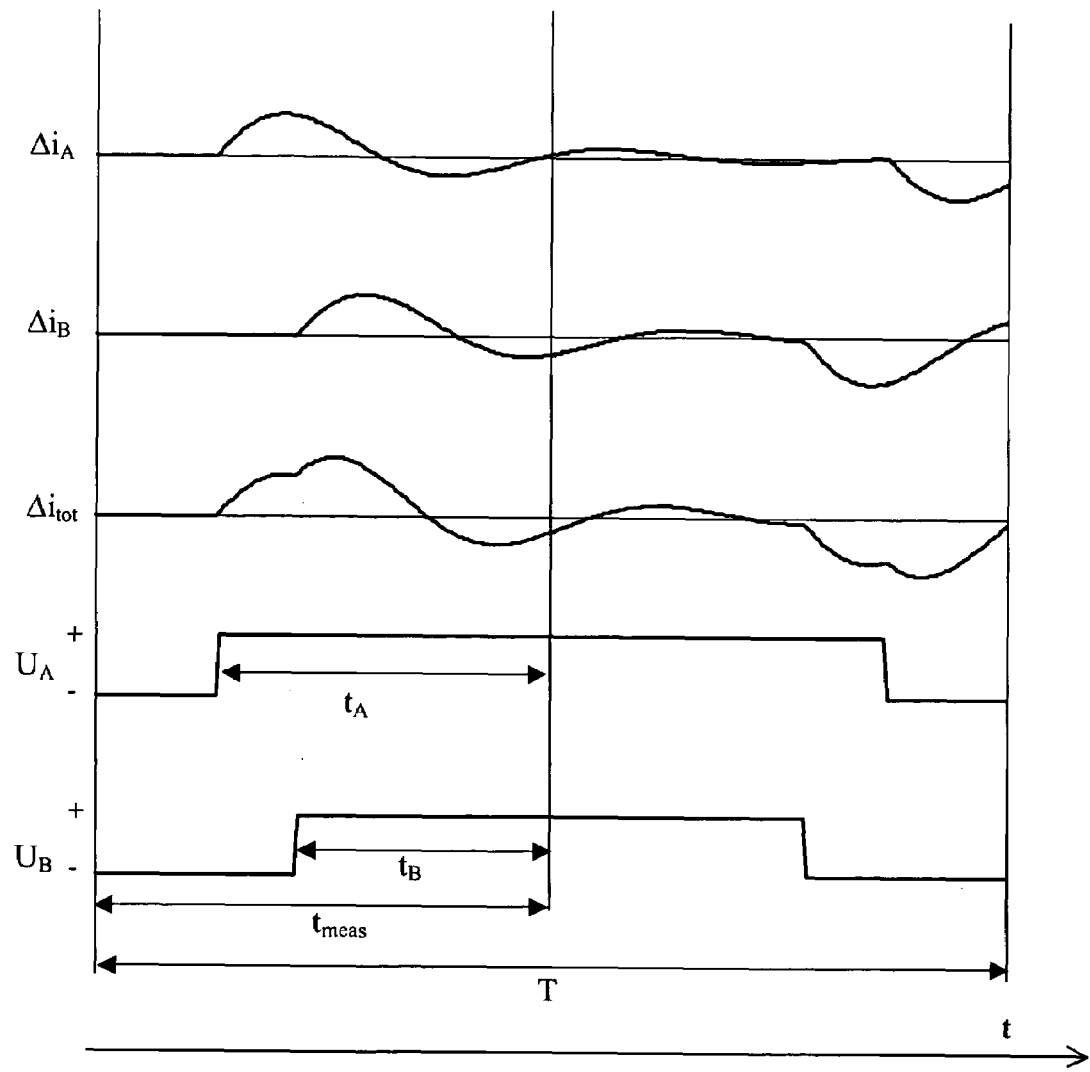
FIG. 4 shows basic waveforms of capacitive stray currents and related voltage pulses.

If data samples are gathered for one phase only, as explained above in detail, then the same values are used for all different phases. If sample data are collected separately for all phases, corresponding stored stray current data for voltage changes of different output phases are used. A preferred embodiment for calculating the phase current is superimposing the stored stray currents. This is explained referring to FIG. 4, which shows state changes of two output phases A and B, stray currents $\Delta i_A$, $\Delta i_B$ caused by voltage changes of phases A and B, and the sum of stray currents $\Delta i_{tot}$. In the example of FIG. 4, only two phases of a three-phase system are modulated and the DC-current is measured in the middle of the modulation period.

The measured data samples are stored in a memory as an array that can be indexed using time. As explained above, the samples are stored in connection with the time from the voltage change. The sum of the stray currents can be calculated by using equation $$\Delta i_{tot} = DIR_A \cdot f(t_A) + DIR_B \cdot f(t_B) + DIR_C \cdot f(t_C)$$

Where $DIR_A$, $DIR_B$ and $DIR_C$ are the direction of change of phases A, B and C, which may obtain a value 1 or −1, and function f(t) represents the stray current values stored, which obtain a value depending on the time between an output state change and the DC-current measurement instant. In the example of FIG. 4, the first output state change occurs at time instant $t_{meas} - t_A$, $t_{meas}$, which is a half of the modulation period T. At this instant, the output of phase A is switched from a negative intermediate circuit voltage to the positive voltage. This voltage change accomplishes stray current $\Delta i_A$, which is shown in FIG. 4.

At time instant $t_{meas} - t_B$, the output of phase B is also controlled to a positive state, and this change also causes capacitive stray currents $\Delta i_B$ to flow. Both of these state changes are from negative potential to positive potential, so both the DIR functions obtain a value 1 in the above equation.

At DC-current measurement instant $t_{meas}$, two currents are superimposed to current $\Delta i_{tot}$. This sum of the stray currents at the measurement instant is the current that needs to be removed from the measured DC current $i_{DC,meas}$ to obtain actual phase current $I_{DC}$. Thus with equation $$i_{DC} = i_{DC,meas} - \Delta i_{tot}$$

the stray currents are removed from the measured current. In the example of FIG. 4, the stray current caused by the change of state of phase A is looked up from the stored data corresponding to time $t_A$, and for the change of phase B corresponding to time $t_B$. These stray current values are then summed and further subtracted from the measured DC-current.

It should be noted that the current waveforms are only drawn for better understanding the invention and the behaviour of the currents. From the stored table, only the values corresponding to $t_A$ and $t_B$ need to be looked up.

Time values from the state change to current measurement $t_A$, $t_B$ and $t_C$ for a three-phase system can be calculated fast if the DC-current measurement is at a predetermined position inside the modulation period. If the DC-current measurement takes place in the middle of the modulation period, as in the above example, the time values are a half of the on-time of the corresponding output switch. The on-time for all the output switches is usually known at the beginning of each modulation period.

If the sample data are stored as function parameters, it is still possible to combine these functions for different phases and calculate a time instant at which the capacitive current has a zero crossing point and carry out the measurement of DC-current at this time instant. This combination of functions is, however, much more time consuming than the pure use of look-up tables.

If the time value from the state change to the current measurement does not exactly correspond to the ones stored in the memory, the current value can be approximated to be the nearest one, or a linear interpolation may be used between the nearest stored current values to obtain a better approximation.

If the capacitive stray currents are severe and are not damped quickly, the effects of currents can be taken into account even from previous modulation periods, using the similar principles as explained above. Usually the currents decay in one modulation period to such a level that the previous modulation periods need not be taken into account.

The method of the present invention can be carried out by means of a processor used in any modern frequency converter. Such processors have a high clock frequency, enabling the current measurement time or the position and duration of the voltage pulse in a modulation period to be set precisely. The method further necessitates a means for storing the collected measurement data, such as a semiconductor memory, and a link between the processor and the memory. The processor can thus store values into storing means and read values from the storing means. The processor can also be programmed to execute the required calculations.

It will be obvious to a person skilled in the art that as technology advances, the inventive concept can be implemented in various ways. The invention and its embodiments are not limited to the examples described above but may vary within the scope of the claims.

The invention claimed is:

1. An arrangement for measuring output phase currents of a voltage source inverter when the inverter is connected to a load, wherein the arrangement comprises
    means for forming consecutive voltage pulses to the load by using the inverter,
    means for measuring current of a DC-bus for each consecutive pulse such that for each consecutive pulse, a time difference between a current measurement instant and a start of a voltage pulse is changed,
    means for removing a value of DC current caused by the consecutive voltage pulses from measured current samples to obtain sample values for stray current,
    means for storing the sample values of the stray current and their time instants with respect to the start of respective voltage pulses, and
    means for determining an output phase current of the inverter during use of the inverter from the measured DC bus current and from the stored stray current samples.

2. A method of measuring output phase currents of a voltage source inverter when the inverter is connected to a load, wherein the method, during the commissioning of a drive, comprises the steps of
    forming consecutive voltage pulses to the load by using the inverter,
    measuring current of a DC bus for each consecutive pulse such that for each consecutive pulse, a time difference between a current measurement instant and a start of a voltage pulse is changed,
    removing a value of DC current caused by the consecutive voltage pulses from measured current samples to obtain sample values for stray current,
    storing the sample values of the stray current and their time instants with respect to the start of respective voltage pulses,
    stopping the formation of the voltage pulses,
    the method further comprising, during use of the inverter, the following steps of
    measuring DC bus current,
    determining an output phase current of the inverter from the measured DC bus current and from the stored stray current samples.

3. A method according to claim 2, wherein the step of measuring the current of the DC bus during the commissioning of the drive comprises steps in which the DC current measurement instant is changed within a modulation period.

4. A method according to claim 2, wherein the step of measuring the current of the DC bus during the commissioning of the drive comprises steps in which the DC current measurement instant is not changed with respect to a modulation period and the starting time of the voltage pulse is changed.

5. A method according to claim 2, wherein the step of removing the value of the DC current comprises a step in which the DC-current is removed from the measured current samples by high-pass filtering the obtained sample data.

6. A method according to claim 2, wherein the step of removing the value of the DC current comprises the steps of,
    estimating the value of the DC current, and
    subtracting the DC current from the sample data.

7. A method according to claim 2, wherein the step of storing the sample values comprises a step in which the sample values are stored in an array indexed by a time value corresponding to the sample value.

8. A method according to claim 2, wherein the step of determining the output phase current of the inverter comprises the steps of
    determining a time difference ($t_A$, $t_B$, $t_C$) between an output phase voltage change and the DC current measurement time instant,
    looking up, from the stored current data, current values corresponding to the time differences, and
    subtracting the looked-up current data from the measured DC current to obtain the output phase current.

9. A method according to claim 8, wherein the step of subtracting the current data comprises a step in which a direction of an output voltage change is taken into account by changing a sign of the looked-up current data if the output phase voltage change is in the opposite direction as compared to the change carried out during the measurement of the samples.

10. A method according to claim 2, wherein the step of storing the sample values comprises the steps of forming a function corresponding to a capacitive stray current from the sample data and storing parameters of the formed function.

11. A method according to claim 10, wherein the step of determining the output phase current of the inverter comprises the steps of
    determining a time difference ($t_A$, $t_B$, $t_C$) between an output phase voltage change and the DC current measurement time instant,
    calculating a value for the stray current with the function by using the time differences as input,
    subtracting the calculated current data from the measured DC current to obtain the output phase current.

12. A method according to claim 2, wherein the step of determining the output phase current of the inverter comprises a step of changing the DC current measurement instant with respect to the start of the output voltage pulses inside a modulation period to a time instant at which the capacitive current has a zero crossing point.

13. A method according to claim 2, wherein the step of determining the output phase current of the inverter comprises a step of changing the start of a voltage pulse inside a modulation period such that capacitive current has a zero crossing point at a predetermined DC current measurement instant inside a modulation period.

14. A method according to claim 2, wherein step of forming consecutive voltage pulses comprises a step in which voltage pulses having a same pulse ratio are formed.

15. A method according to claim 14, wherein the step of measuring the current of the DC bus during the commissioning of the drive comprises steps in which the DC current measurement instant is changed within a modulation period.

16. A method according to claim 15, wherein the step of removing the value of the DC current comprises the steps of,
estimating the value of the DC current, and
subtracting the DC current from the sample data.

17. A method according to claim 15, wherein the step of removing the value of the DC current comprises a step in which the DC-current is removed from the measured current samples by high-pass filtering the obtained sample data.

18. A method according to claim 17, wherein the step of storing the sample values comprises a step in which the sample values are stored in an array indexed by a time value corresponding to the sample value.

19. A method according to claim 18, wherein the step of storing the sample values comprises the steps of forming a function corresponding to a capacitive stray current from the sample data and storing parameters of the formed function.

20. A method according to claim 19, wherein the step of determining the output phase current of the inverter comprises the steps of
determining a time difference ($t_A$, $t_B$, $t_C$) between an output phase voltage change and the DC current measurement time instant,
looking up, from the stored current data, current values corresponding to the time differences, and
subtracting the looked-up current data from the measured DC current to obtain the output phase current.

\* \* \* \* \*